US006441598B1

(12) United States Patent
Ivanov

(10) Patent No.: US 6,441,598 B1
(45) Date of Patent: Aug. 27, 2002

(54) SYNCHRONOUS RECTIFIER CIRCUIT AND METHOD OF USE IN SWITCHING VOLTAGE CONVERTER

(75) Inventor: Vadim V. Ivanov, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/010,632

(22) Filed: Nov. 5, 2001

(51) Int. Cl.$^7$ .............................. G05F 1/40; G05F 1/44
(52) U.S. Cl. ..................... 323/284; 323/272; 323/283
(58) Field of Search .................................. 323/271, 272, 323/282, 283, 284, 285

(56) References Cited

U.S. PATENT DOCUMENTS

| 5,731,694 A | * | 3/1998 | Wilcox et al. ............... 323/224 |
| 5,912,552 A | * | 6/1999 | Tateishi ........................ 323/224 |
| 5,946,207 A | * | 8/1999 | Schoofs ........................ 363/127 |
| 6,229,289 B1 | * | 5/2001 | Piovaccari et al. .......... 323/224 |
| 6,275,016 B1 | * | 8/2001 | Ivanov ........................ 323/224 |
| 6,307,356 B1 | * | 10/2001 | Dwelley ...................... 323/282 |
| 6,310,466 B1 | * | 10/2001 | Criscione .................... 323/222 |
| RE37,609 E | * | 3/2002 | Bittner ........................ 323/224 |

* cited by examiner

Primary Examiner—Bao Q. Vu
(74) Attorney, Agent, or Firm—W. Daniel Swayze, Jr.; W. James Brady; Frederick J. Telecky, Jr.

(57) ABSTRACT

A voltage converter circuit includes a first transistor (M1) having a drain connected to receive an unregulated input voltage (Vin), a gate connected to receive a feedback control signal (4), and a source connected to a first conductor (5). An inductor (6) having a first terminal coupled to the first conductor (5) and a second terminal use connected to produce a regulated output voltage (Vout) on an output conductor (7). A feedback control circuit (190) coupled between the gate of the first transistor (M1) and the output conductor for regulating switching of the first transistor in response to the regulated output voltage (Vout). A synchronous rectifier circuit includes a comparator (120) having an inverting input coupled to the first conductor (5) and a non-inverting input coupled to the reference voltage conductor (3), a logic circuit (140) having an input coupled to an output (13) of the comparator, a first output (15), and a second output (9), a second transistor (M2-1) having a gate coupled to the first output (15), a source coupled to the reference voltage conductor (3), and a drain coupled to the first conductor (5), and a third transistor (M2-2) having a gate coupled to the second output (9), a source coupled to the reference voltage conductor (3), and a drain coupled to the first conductor (5).

42 Claims, 4 Drawing Sheets

SYNCHRONOUS RECTIFIER CIRCUIT AND METHOD OF USE IN SWITCHING VOLTAGE CONVERTER

BACKGROUND OF THE INVENTION

The present invention relates generally to synchronous rectifier circuits, and more particularly to "buck", "boost" and other switching voltage converter circuits (i.e., voltage regulator circuits) that include synchronous rectifier circuits, and still more particularly to such voltage converter circuits which operate with reduced power dissipation and improved efficiency.

FIG. 1 shows a conventional buck switching voltage converter 1 that includes a synchronous rectifier. The synchronous rectifier includes a large, low-resistance MOS N-channel transistor M2 having its source connected to a ground conductor 3, its gate being coupled by logic circuitry 14 to the output of a comparator 12 having its (+) input connected to a ground conductor 3 and its (−) input connected by conductor 5 to the drain of transistor M2. Logic circuitry 14 typically includes a latch circuit that prevents comparator 12 from turning transistor M2 on more than once during each switching cycle. This can occur if the offset of comparator 12 is negative and causes transistor M2 to be turned off "early", in which case the magnitude of the $V_{DS}$ voltage between the drain and source of transistor M2 rapidly increases to equal the forward bias voltage of a "body diode" D and then decreases back down to the threshold voltage of comparator 12. Transistor M2 inherently includes the drain-to-substrate body diode D, with its N-type cathode region common with the drain and its P-type anode connected to the source of transistor M2.

Voltage converter circuit 1 also includes an input conductor 2 receiving an unregulated voltage Vin and applying it to the drain of an N-channel switching transistor M1. The source of transistor M1 is connected by conductor 5 to the drain of transistor M2 and to a first terminal of an inductor 6 having an inductance L. A second terminal of inductor 6 is connected by an output conductor 7 to a first terminal of a load or output capacitor 8 having a capacitance C. As is well known to those skilled in the art, an inductor current $I_{INDUCTOR}$ flows back and forth between inductor 6 and capacitor 8 during operation of voltage converter circuit 1. The second terminal of load capacitor 8 is connected to ground conductor 3. A regulated output voltage Vout is produced on output conductor 7. The regulated output voltage Vout is applied to an input of a feedback control circuit 19 that compares Vout with a reference voltage and accordingly produces a signal on conductor 4 to control the switching of transistor M1 so as to cause voltage regulator circuit 1 to maintain the desired regulated value of Vout.

In any integrated circuit manufacturing process, the comparator (such as comparator 12 FIG. 1) has an inherent offset voltage, which may be positive or negative. The value of the comparator offset voltage produced by any particular integrated circuit manufacturing process has a statistical distribution.

In operation, switching transistor M1 is turned on during the initial part of each switching cycle. This causes current to flow from the source of the unregulated voltage Vin through transistor M1 and inductor 6 such that conductor 7 supplies current to maintain the desired value of output voltage Vout across a load capacitor 8 that may be connected to conductor 7 and/or across any additional external load that may be connected to conductor 7. During this portion of the switching cycle, the voltage of conductor 5 is high, so the output of comparator 12 is at a logical "0" level. The low "0" output voltage produced by comparator 12 causes logic circuit 14 to keep transistor M2 turned off. The flow of $I_{INDUCTOR}$ into load capacitor 8 increases the value of Vout to the desired regulated value determined by a reference voltage within feedback control circuit 19, which then produces a signal on conductor 4 that abruptly turns switching transistor M1 off.

The current $I_{INDUCTOR}$ cannot change abruptly, and therefore continues to flow from conductor 5 through inductor 6 and conductor 7. This causes the voltage on conductor 5 to rapidly decrease to a level approximately 600 millivolts below ground, at which point body diode D becomes forward biased enough to supply the current $I_{INDUCTOR}$. The low voltage on conductor 5 causes comparator 12 to switch, causing it to produce a high logical "1" output level. That causes logic circuit 14 to produce a high voltage level on the gate of transistor M2 after a short delay, turning transistor M2 on.

The size of transistor M2 is selected so that when it is turned on, its channel resistance (Ron) is low enough that its drain-to-source voltage $V_{DS}$ is reduced from the approximately 600 millivolt forward bias voltage of body diode D to only approximately 100 millivolts (which reverse biases body diode D). Therefore, the power dissipation due to the flow of $I_{INDUCTOR}$ through transistor M2 after it is turned on is much lower than the power dissipation due to the flow of $I_{INDUCTOR}$ through body diode D before transistor M2 is turned on. After transistor M1 is turned off, the magnitude of $I_{INDUCTOR}$ gradually decreases at the rated $(I_{INDUCTOR})/dt=$ Vout/L. Therefore, the drain-source voltage $V_{DS}$ voltage of transistor M2 decreases at roughly the same rate as $I_{INDUCTOR}$ until the $V_{DS}$ of transistor M2 is equal to the offset voltage of comparator 12, which typically can be as large as approximately 10 millivolts above or below ground.

Typically, the size of transistor M2 is chosen so that when the maximum value of $I_{INDUCTOR}$ is flowing through the channel resistance of transistor M2, its $V_{DS}$ voltage is approximately equal to the above mentioned 100 millivolts. The 10 millivolt offset voltage of comparator 12 typically corresponds to roughly 10 percent of the maximum value of $I_{INDUCTOR}$. If, for example, the magnitude of the offset voltage of comparator 12 is 10 millivolts, the decreasing $V_{DS}$ voltage causes comparator 12 to turn off transistor M2 either too soon or too late, depending on whether the offset voltage is positive or negative. In either case, the power dissipation is substantially increased. If the offset voltage is negative, transistor M2 is turned off too late, and then it draws current from load capacitor 8 and any additional load that is connected to output conductor 7. Even if the net current flow out of conductor 7 to an external load (not shown) is zero, $I_{INDUCTOR}$ at that time has a value equal to approximately 10 percent of the maximum current through inductor 6 and oscillates between inductor 6 and load capacitor 8, and also flows through the channel resistance of transistor M2 and dissipates power therein.

If the comparator offset voltage is positive, then transistor M2 will be turned off too soon. In that case, there is still up to approximately 10 percent of the maximum inductor current still flowing in inductor 6, and it flows through the large 600 millivolt forward bias voltage of body diode D, and consequently dissipates a large amount of power.

Thus, the prior art buck voltage converter 1 of FIG. 1 is characterized by decreased conversion efficiency for either positive or negative offset voltages of comparator 12.

Synchronous rectifier circuits of the kind described above also can be used in motor control circuits, class D audio amplifiers, and other circuitry.

Thus, there is an unmet need for an improved synchronous rectifier that accomplishes improved conversion efficiency when used in a utilization circuit such as an integrated circuit voltage converter, a motor control circuit, a class D audio amplifier, or the like.

SUMMARY OF THE INVENTION

Accordingly, it is an object of the present invention to provide an improved synchronous rectifier circuit having reduced power dissipation when used in conjunction with a utilization circuit.

It is another object of the present invention to provide an improved synchronous rectifier circuit having reduced power dissipation when used in conjunction with a signal conversion circuit.

It is another object of the present invention to provide an improved synchronous rectifier circuit having reduced power dissipation when used in conjunction with a voltage converter circuit.

It is another object of the present invention to provide an improved synchronous rectifier circuit having reduced power dissipation when used in conjunction with a buck voltage converter circuit.

It is another object of the present invention to provide an improved synchronous rectifier circuit having reduced power dissipation when used in conjunction with a boost voltage converter circuit.

It is another object of the present invention to provide an improved synchronous rectifier circuit which avoids the above described problems of the prior art.

It is another object of the invention to provide an improved voltage converter circuit including a synchronous rectifier.

It is another object of the invention to avoid undesirable effects of delay through a comparator in a synchronous rectifier of a voltage converter or other utilization device such as a motor control circuit or a class D audio amplifier to decrease power dissipation.

Briefly described, and in accordance with one embodiment, the present invention provides a synchronous rectifier circuit suitable for use in conjunction with a utilization circuit such as a signal conversion circuit. In its broadest aspects, the synchronous rectifier circuit includes a comparator (120) having first input coupled to a first conductor (5) and a second input coupled to a reference voltage conductor (3). Typically, the first conductor conducts a current that also flows through an inductor. The synchronous rectifier circuit includes a logic circuit (140) having an input coupled to an output (13) of the comparator, a first output (15), and a second output (9), a first transistor (M2-1) having a gate coupled to the first output (15), a source coupled to the reference voltage conductor (3), and a drain coupled to the first conductor (5), and a second transistor (M2-2) having a gate coupled to the second output (9), a source coupled to the reference voltage conductor (3), and a drain coupled to the first conductor (5).

In the described embodiments, the synchronous rectifier circuit is included in a voltage converter circuit. In one embodiment the synchronous rectifier circuit includes a comparator (12) having an inverting input coupled to a first conductor (5) and a non-inverting input coupled to a reference voltage conductor (3), a logic circuit (140) having an input coupled to an output (13) of the comparator, a first output (15), and a second output (9), and transistor circuitry including first and second transistor sections. The first transistor section (M2-1) has a gate coupled to the first output (15), a source coupled to the reference voltage conductor (3), and a drain coupled to the first conductor (5). The second transistor section (M2-2) has a gate coupled to the second output (9), a source coupled to the reference voltage conductor (3), and a drain coupled to the first conductor (5). The logic circuit (140) is operative to turn on both the second transistor section (M2-1) and the third transistor section (M2-2) in response to a first switching of the comparator (12) to a "1" level, and to turn off only the first transistor section (M2-1) in response to a second switching of the comparator to the "1" level, and to turn the off second transistor section (M2-2) in response to a third switching of the comparator to the "1" level. The logic circuit (140) also is operative to turn on both the second transistor section (M2-1) and the second transistor section (M2-2) in response to a first switching of the comparator from a "0" level to a "1" level and to turn off the first transistor section (M2-1) if the comparator does not then switch from the "1" level to the "0" level within a predetermined delay.

The voltage converter circuit includes a first transistor (M1) having a drain connected to receive an unregulated input voltage (Vin), a gate connected to receive a feedback control signal (4), and a source connected to a first conductor (5). An inductor (6) includes a first terminal coupled to the first conductor (5) and a second terminal connected to produce a regulated output voltage (Vout) on an output conductor (7). A load or output capacitor (8) is coupled between the output conductor and a reference voltage conductor (3). A feedback control circuit (19) is coupled between the gate of the first transistor (M1) and the output conductor for regulating switching of the first transistor in response to the regulated output voltage (Vout) so as to maintain it at a desired value.

In another embodiment the synchronous rectifier is included in a boost voltage regulator.

DETAILED DESCRIPTION OF THE PREFERRED EMBODIMENTS

Figure 1:
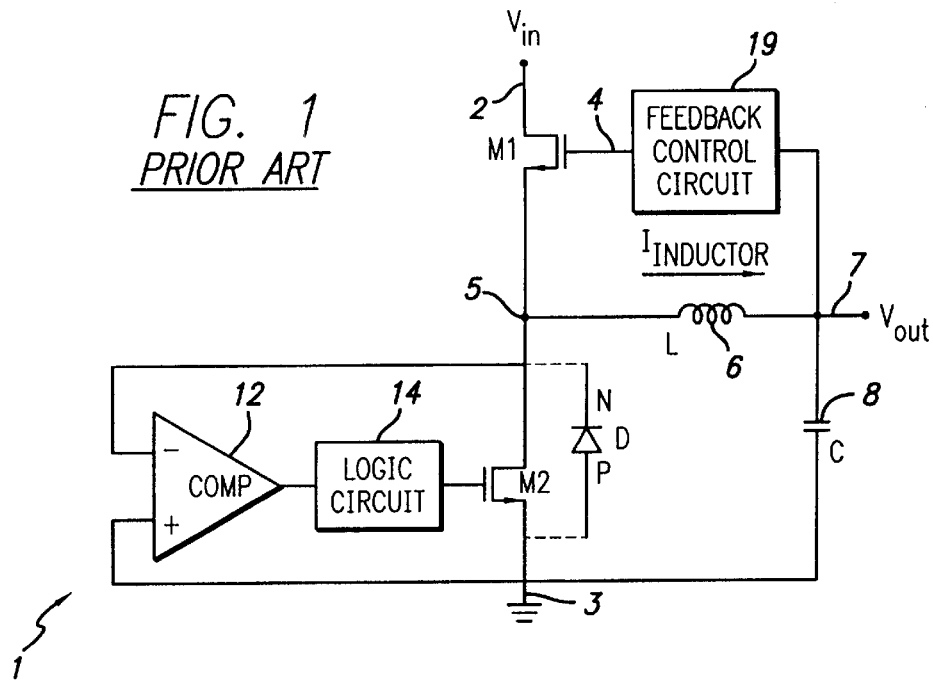
FIG. 1 is a schematic diagram of a prior art synchronous rectifier connected in a buck voltage converter circuit.
Figure 2:
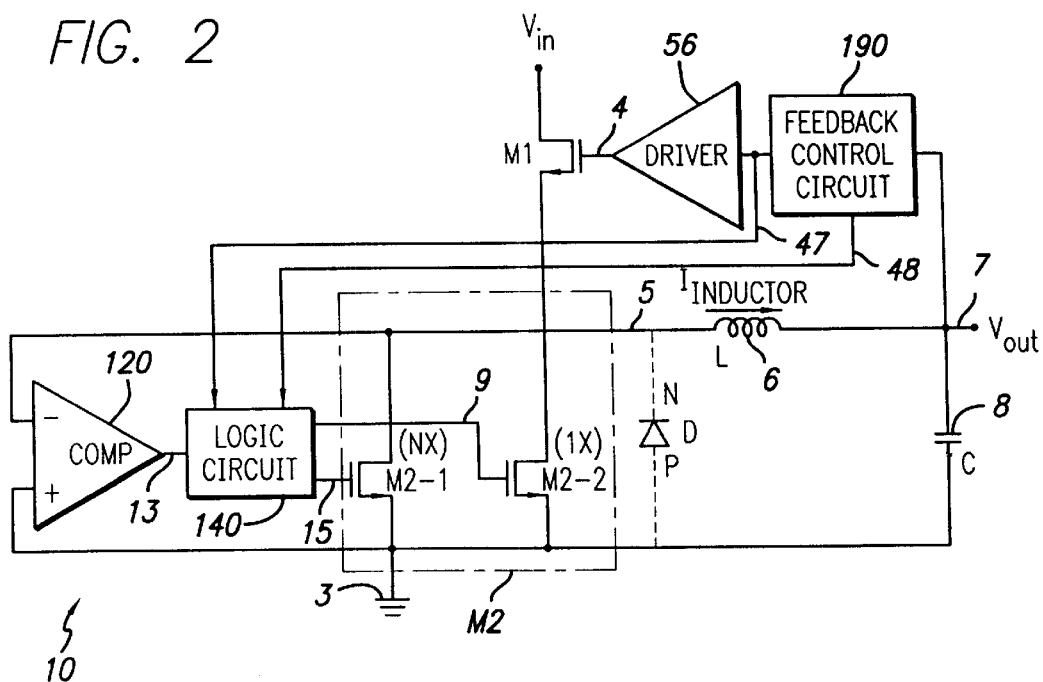
FIG. 2 is a schematic diagram of a synchronous rectifier of the present invention, connected in a buck voltage converter circuit.

Referring to FIG. 2, the illustrated buck voltage converter circuit 10 is similar to the one in prior art FIG. 1, except that in FIG. 2 an improved synchronous rectifier circuit is provided that includes comparator 12, logic circuit 140, and at least two N-channel transistors or transistor sections M2-1 and M2-2. An output of feedback control circuit 190 is connected to a conductor 47 that is connected to an input of a driver/level shift circuit 56 that produces a suitably high drive voltage on conductor 4 to fully turn on transistor M1. The signal on a conductor 47 therefore is essentially coincident with the gate drive signal on conductor 4 which turns transistor M1 on.

Logic circuit 140 includes circuitry (subsequently described) responsive to the signal on conductor 47 to control the turn-on of a composite transistor M2 so as to prevent "shoot-through" currents which otherwise would occur if transistors M1 and M2 are both simultaneously in an on condition. The circuitry referred to also bypasses and thereby avoids delay associated with comparator 120 so as to substantially reduce power dissipation across the large forward bias voltage of body diode D when the inductor current is large, and is subsequently described with reference to FIG. 5.

In FIG. 2, transistor M2 of prior art FIG. 1 is replaced by a "composite" transistor M2 including a transistor section M2-1 and a transistor section M2-2 which have a common source electrode, a common drain electrode, and two separate gate electrodes connected to conductors 9 and 15, respectively. (Alternatively, composite transistor M2 could be replaced by two separate transistors M2-1 and M2-2 connected as shown.) The gate electrode of transistor section M2-1 is connected by conductor 15 to a first output of logic circuit 140, and the gate electrode of transistor section M2-2 is connected by conductor 9 to a second output of logic circuit 140. The common source of transistor sections M2-1 and M2-2 is connected to ground conductor 3, and the common drain thereof is connected to conductor 5. The channel-width-to-channel-length ratio of transistor section M2-1 is N times greater than that of transistor section M2-2, so the channel resistance (Ron) of transistor section M2-2 is N times that of transistor section M2-1.

Comparator 120 of FIG. 2 is different than comparator 12 of prior art FIG. 1, in that comparator 120 includes a built-in negative offset voltage the magnitude of which is slightly larger than the statistical offset voltage variation that would be present in any large sample of comparators 120 manufactured by the CMOS manufacturing process to be utilized to make buck voltage converter circuit 10. The built-in negative offset voltage $V_{offset}$ (see horizontal dashed line 22 of FIG. 3) of comparator 120 causes it to switch so as to produce a "1" level on conductor 13 when the voltage on conductor 5 decreases to a voltage that is equal to a negative offset of $V_{offset}$ volts less than the voltage on the (+) input of comparator 120, i.e., ground or zero volts.

When a logic "1" level is first produced by comparator 120 on conductor 13, logic circuit 140 produces high voltages on both conductors 9 and 15 so as to turn on both transistor section M2-1 and transistor section M2-2, provided the magnitude of $I_{INDUCTOR}$ flowing out of the drain of composite transistor M2 is sufficiently large to cause its $V_{DS}$ voltage $V_{DS(M2)}$ to be large enough to cause comparator 120 to switch its output back to a "0" level as soon as transistor sections M2-1 and M2-2 are turned on.

After transistor sections M2-1 and M2-1 have been switched on by comparator 120 and logic circuit 140 in response to the rapid decrease of $V_{DS(M2)}$ caused by transistor M1 being turned off, the composite transistor M2 including transistor sections M2-1 and M2-2, operating in combination with logic circuit 14, permits the lower resistance transistor section M2-1 to be switched off first, at the time when the slowly decreasing $V_{DS(M2)}$ voltage (caused by the slowly decreasing flow of $I_{INDUCTOR}$ through the channel resistance of composite transistor M2) reaches the threshold voltage of comparator 120. This causes comparator 120 to switch its output from a "0" level to a "1" level, causing logic circuit 140 to turn off transistor section M2-1. As a result of the lower resistance transistor section M2-1 being turned off and the higher resistance section (M2-2 remaining on, the magnitude of the $V_{DS(M2)}$ voltage rapidly increases to a level well above the magnitude of the threshold voltage of comparator 120.

The magnitude of the $V_{DS(M2)}$ voltage then gradually decreases from that level proportionally to the decrease in the magnitude of $I_{INDUCTOR}$. When the magnitude of the $V_{DS(M2)}$ voltage again reaches the magnitude of the threshold of comparator 120, it again switches its output $V_{13}$ from a "0" level to a "1" level, and this time causes logic circuit 140 to turn off the second transistor section M2-2. From that point until the end of the present switching cycle, any remaining inductor current flows through the relatively large 600 millivolt voltage drop of body diode D.

It is undesirable for the offset voltage of comparator 120 to be positive, because that causes transistor section M2-1 to be switched off later. Therefore, comparator 120 preferably is designed so that it has a built-in negative offset voltage the magnitude of which is slightly greater than the statistical range of offset voltages that otherwise would be expected for the integrated circuit manufacturing process to be used. Consequently, the lower resistance transistor section M2-1 always will be turned off a bit early. (A built-in negative offset voltage of either positive or negative polarity is easily accomplished in any comparator or differential amplifier input stage by simply providing different size input transistors that are ratioed so as to provide the desired polarity and magnitude of the offset voltage.)

If transistor section M2-1 is turned off early, there is additional power loss because $I_{INDUCTOR}$ is larger at the time comparator 120 switches than is the case if transistor section M2-1 is turned off later. That larger amount of $I_{INDUCTOR}$ flows first through the relatively large 600 millivolt forward bias voltage drop of body diode D and dissipates therein a substantial amount of power, and later flows across the approximately 100 millivolt $V_{DS(M2)}$ voltage of composite transistor M2, then dissipating substantially less power.

In accordance with present invention, above mentioned power loss is reduced by ensuring that only a relatively low resistance section (a relatively large channel-width-to-channel-length section) of composite transistor M2 is turned off early, and the remaining high resistance section of composite tranisistor M2 is left on. This prevents the present amount of $I_{INDUCTOR}$ at the time transistor section M2-1 is turned off from flowing across the large 600 millivolt drop of body diode D and causes it to instead flow through the channel resistance of the high resistance section of transistor M2-2 that has been left on, so as to produce a $V_{DS(M2)}$ voltage of only approximately 100 millivolts instead of the 600 millivolt forward bias voltage drop across body diode D. This substantially reduces the power dissipation during the immediately following portion of the switching cycle, and therefore substantially increases the conversion efficiency of the voltage converter 10 shown in FIG. 2.

When the $V_{DS(M2)}$ voltage on conductor 5 has decreased enough due to the decreasing of $I_{INDUCTOR}$ to again reach the built-in negative offset threshold of comparator 120, it again switches its output so as to cause logic circuit 140 to also turn off transistor section M2-2.

The operation of voltage converter 10 of FIG. 2, for a relatively large initial value of $I_{INDUCTOR}$ at the beginning of the switching cycle, can be understood by referring to FIG.

3, which is a timing diagram including the waveform of the drain-to-source voltage $V_{DS(M2)}$ across composite transistor M2 (which is equal to the voltage on conductor 5), the waveform of the comparator output voltage $V_{13}$ on conductor 13, and the waveform of the inductor current $I_{INDUCTOR}$.

Figure 3:
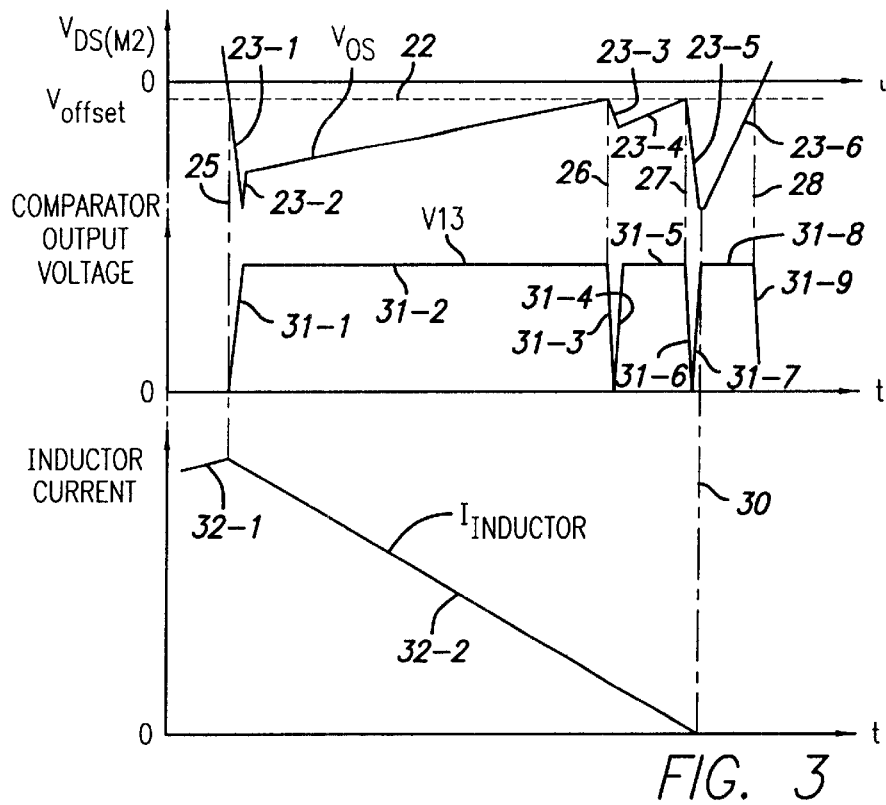
FIG. 3 is a timing diagram useful in describing the operation of the synchronous rectifier included in FIG. 2 for large values of the inductor current.

Referring to FIG. 3, the steep downward segment 23-1 of the $V_{DS(M2)if}$ waveform occurs as a result of transistor M1 being abruptly turned off. (As those skilled art will realize, the current-carrying electrode of an N-channel MOS transistor presently having the highest voltage functions as a drain electrode, and the other current-carrying electrode functions as a source electrode. Therefore, the roles of the two current-carrying electrodes of an MOS transistor are reversed as the voltage of one of them increases above the voltage of the other during circuit operation. Therefore, in both the description and claims herein, it is to be understood that when an electrode of an MOS transistor is referred to as a "source", this indicates the electrode having an arrow thereon in the drawings, but does not necessarily indicate whether that electrode functions as a source, or a drain, or both, of the MOS transistor.)

At the time indicated by vertical dashed line 25, segment 23-1 of the $V_{DS(M2)}$ waveform (also referred to as the $V_{DS(M2)}$ waveform) has decreased to the level of the negative comparator offset voltage $V_{offset}$ represented by dashed line 22, and continues going more negative until body diode D becomes forward biased at approximately 600 millivolts below ground. Comparator 120 switches when $V_{DS(M2)}$ falls below the level of the $V_{offset}$ voltage indicated by horizontal dashed line 22, causing the comparator output on conductor 13 to rise as indicated by segment 31-1 of the $V_{13}$ waveform.

When transistor M1 is turned off, $I_{INDUCTOR}$ stops increasing, as indicated by segment 32-1 of the $I_{INDUCTOR}$ waveform and begins decreasing as indicated by segment 32-2. Comparator 120 switches its output from a "0" to a "1" when $V_{DS(M2)}$ reaches the threshold voltage of comparator 120. This causes logic circuit 140 to turn on both transistor sections M2-1 and M2-2. When composite transistor M2 is thus turned on, it rapidly pulls $V_{DS(M2)}$ upward from the approximately 600 millivolt level below ground caused by body diode D to the voltage defined by the "on" channel resistance of composite transistor M2 and $I_{INDUCTOR}$ (usually designed to be approximately 100 millivolts below ground at the maximum value of $I_{INDUCTOR}$), as indicated by segment 23-2. As the inductor current decreases, $V_{DS(M2)}$ goes higher from an initial value below ground to the offset voltage of comparator 120. The typical offset voltage of a CMOS comparator can be as high as 10 millivolts, so the predetermined value of $V_{offset}$ should exceed this value. At that point, comparator 120 switches again, at the time indicated by vertical dashed line 26, and $V_{13}$ undergoes a transition indicated by segment 31-3 in FIG. 3. This causes logic circuit 140 to turn off the low-resistance transistor section M2-1, thereby abruptly increasing the channel resistance of the composite transistor M2 to the high resistance value of transistor section M2-2. The flow of $I_{INDUCTOR}$ through the increased channel resistance therefore causes the value of $V_{DS(M2)}$ to rapidly decrease, as indicated by segment 23-3 of the $V_{DS(M2)}$ waveform. This operation causes comparator 120 to switch back to a "1" level, as indicated by segment 31-4 in FIG. 3.

As $I_{INDUCTOR}$ continues decreasing along segment 32-2, $V_{DS(M2)}$ increases as indicated by segment 23-4 until $V_{DS(M2)}$ again reaches the threshold of comparator 120, causing its output voltage $V_{13}$ to switch again, as indicated by segment 31-6. That causes logic circuit 140 to turn off transistor segment M2-2, so the present value of $I_{INDUCTOR}$ causes $V_{DS(M2)}$ to sharply decrease to the −600 millivolt level established by the forward bias voltage of body diode D. The decreasing of $V_{DS(M2)}$ along segment 23-5 causes comparator 120 to switch again, as indicated by segment 31-7. When $I_{INDUCTOR}$ becomes equal to 0, $V_{DS(M2)}$ becomes somewhat undefined, as indicated by the dashed line segment 23-6. After transition 31-6 of $V_{13}$, a latch circuit (not shown) in logic circuit 140 operates to keep composite transistor M2 in its off condition.

Figure 4:
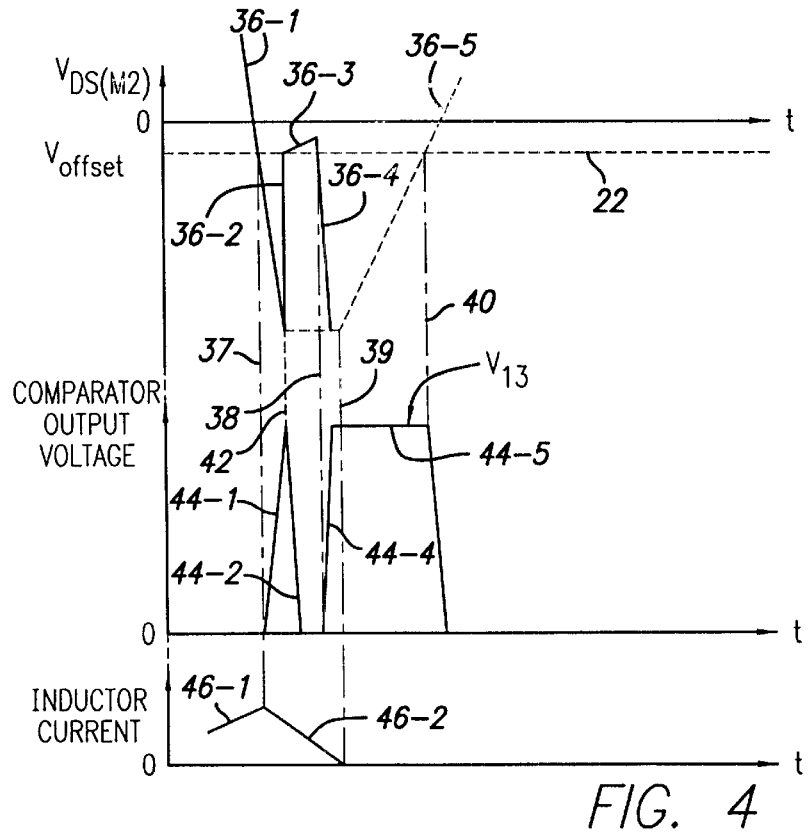
FIG. 4 is a schematic diagram useful in describing the operation of the synchronous rectifier circuit included in FIG. 2 for low values of the inductor current.

In the case in which the initial value of $I_{INDUCTOR}$ is very low, the waveform shown in FIG. 4 is useful in explaining the operation of voltage conversion circuit 10. If the initial value of $I_{INDUCTOR}$ is very low, then comparator 120 first switches as indicated by segment 44-1, causing $V_{13}$ to go to a "1" level in response to $I_{INDUCTOR}$ being supplied through the 600 millivolt forward bias voltage of body diode D. Comparator 120 then causes $V_{13}$ to immediately go to a "0" level, as indicated by segment 44-2. (Note that this is unlike the previously described high current case illustrated in FIG. 3, wherein $V_{13}$ remains at the "1" level as indicated by segment 31-2 of the $V_{13}$ waveform.) The "1" level at the top of the segment 44-1 of the $V_{13}$ waveform in FIG. 4 causes logic circuit 140 to initially turn on both transistor sections M2-1 and M2-2 of composite transistor M2, which causes the value of $V_{DS(M2)}$ to rise toward $V_{offset}$ as indicated by segment 36-2 of the $V_{DS(M2)}$ waveform. When $V_{DS(M2)}$ reaches $V_{offset}$ comparator 120 immediately causes $V_{13}$ to undergo a transition 44-2 back to a "0" level, as indicated by segment 44-2 of the $V_{13}$ waveform, and logic circuit 140 turns off the low resistance transistor section M2-1. Since $I_{INDUCTOR}$ is very small, it causes the value of $V_{DS(M2)}$ to stay above the threshold value $V_{offset}$ of comparator 120 as indicated by segment 36-3, and comparator 120 continues to hold $V_{13}$ at a "0" level.

If logic circuit 140 determines that $V_{13}$ does not increase to a "1" level after transistor section M2-1 has been turned off, then logic circuit 140 also turns off transistor section M2-2. That causes the comparator output voltage $V_{13}$ to increase to a "1" level as indicated by segment 44-4. But even after both transistor sections M2-1 and M2-2 are turned off, $I_{INDUCTOR}$ is still greater than zero. That means the voltage $V_{DS(M2)}$ will rapidly fall to the −600 millivolt level established by body diode D. That large magnitude of $V_{DS(M2)}$ causes comparator 120 to be turned on so as to produce a "1" level at its output. (The above mentioned latch circuit in logic circuit 140 prevents this from affecting the state of voltage converter circuit 10.) Eventually, $I_{INDUCTOR}$ decreases to zero, and when it reaches zero, with composite transistor M2 completely off, the voltage $V_{DS(M2)}$ is determined by parasitic capacitance on conductor 5 and parasitic leakage currents and therefore is indeterminate, as indicated by dashed line segment 36-5 of the $V_{DS(M2)}$ waveform.

Figure 5:
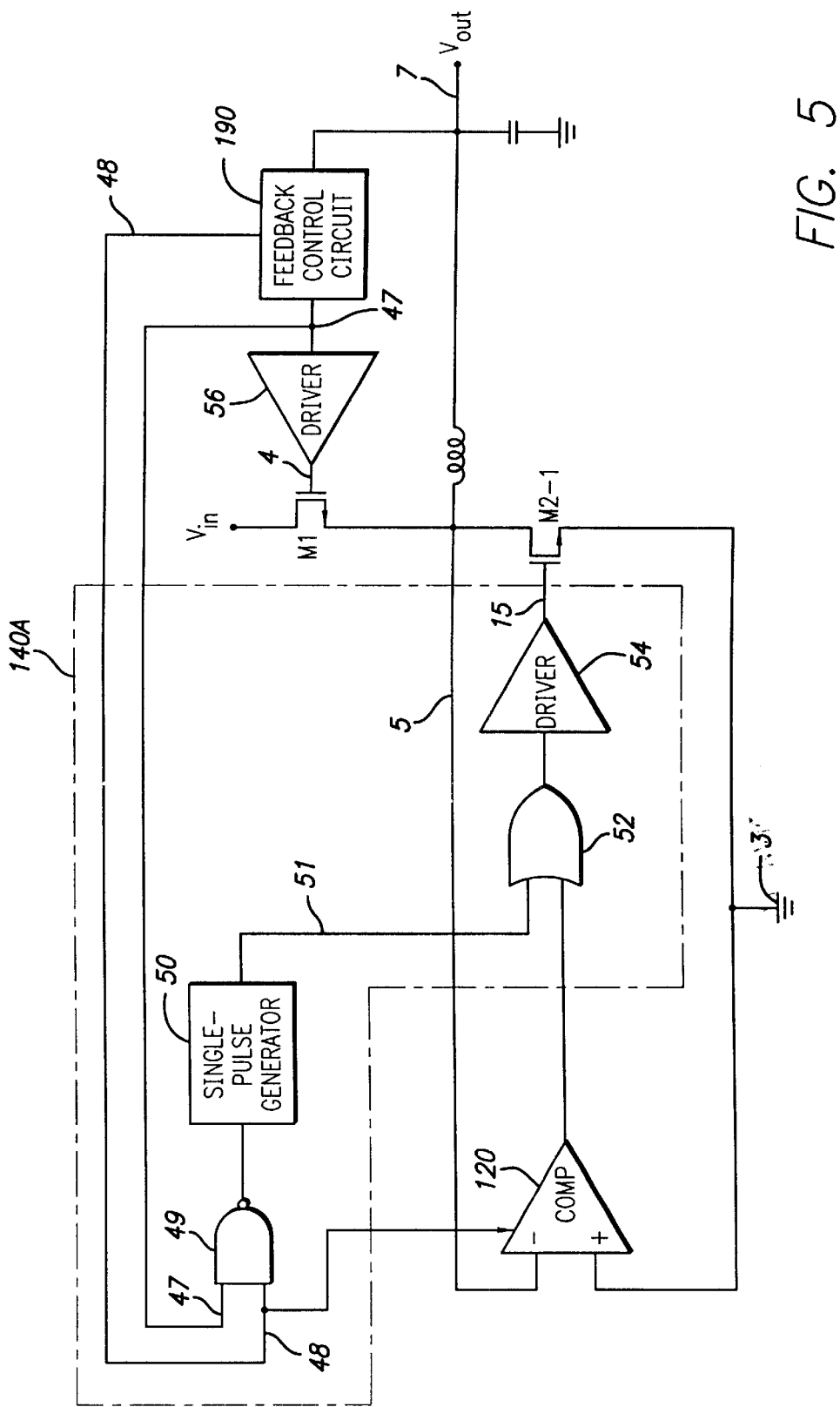
FIG. 5 is a schematic diagram useful in describing a practical implementation of logic circuit 140 of FIG. 2.

Those skilled in the art will recognize that logic circuit 140 can be readily implemented in a variety of ways so as to perform the above described functions. For example, FIG. 5 shows a partial implementation wherein logic circuitry 140A is the portion of logic circuit 140 that prevents shoot-through currents. Logic circuitry 140A includes a NAND gate 49 having a first input connected to conductor 47 and a second input connected to conductor 48.

Conductor 47 is connected to the input of the above-mentioned driver circuit 56 and to the output of feedback control circuit 190, so the logic signal on conductor 47 is nearly coincident with the boosted drive signal on conductor 4 that turns on transistor M1. Conductor 48 is connected to the enable input of comparator 120 and to a comparator enable output of feedback control circuit 190. The comparator enable signal produced on conductor 48 by feedback control circuit 190 disables comparator 120 immediately before producing a "1" signal on conductor 47 to causes driver 56 to produce a large positive signal on conductor 4 and thereby turn on transistor M1, to ensure that both transistor sections M21-1 and M2-2 are completely off before transistor M1 is turned on. Similarly, the comparator enable signal on conductor 48 enables comparator 120 immediately after transistor M1 is turned off. The logic signal on conductor 47 is delayed relative to the logic signal on conductor 48 such that comparator 120 is disabled before transistor M1 is turned on. Similarly, the logic signals on conductor 47 and 48 are timed so that comparator 120 is enabled as soon as transistor M1 is turned completely off.

However, the delay through comparator 120 is relatively long, so the purpose of the logic signal on conductor 47, NAND gate 49, single-pulse generator 50, and OR gate 52 is to provide a much faster turn on signal to transistor M2-1 on conductor 15 than can be applied to comparator 120. This reduces the amount of time that the conductor current $I_{INDUCTOR}$ needs to be flowing through the 600 millivolt forward bias voltage of body diode D, and if $I_{INDUCTOR}$ is large, the reduction in power dissipation in body diode D can be very substantial.

The output of NAND gate 49 is connected to the input of a single-pulse generator circuit 50, the output of which is connected by conductor 51 to a first input of an OR gate 52. Single-pulse generator circuit 51 operates to, in effect, override comparator 120 so as to rapidly produce a fixed-duration output pulse on conductor 51 in response to each negative transition of the output of NAND gate 49. The second input of OR gate 52 is connected to conductor 13 to receive output signals produced by comparator 120. The output of OR gate 52 is connected by conductor 53 to the input of a driver circuit 54, the output of which is connected by conductor 15 to the gate of transistor section M2-1. (Single-pulse generator circuit 50 can be a one-cycle oscillator circuit. Or alternatively, a latch circuit can be utilized in conjunction with additional logic circuitry to provide the same function.)

To summarize, feedback control circuit 190 produces a "1" level on conductor 47 when the voltage on conductor 4 in FIG. 2 falls below the threshold voltage at which transistor M1 is turned off. This causes NAND gate 49 to trigger single-pulse generator circuit 50 to produce a fixed-duration "1" level on conductor 51, which in turn causes OR gate 52 to produce a "1" pulse of the same duration on conductor 53 and thereby rapidly cause driver 54 to turn on transistor section M2-1 for that fixed duration, and simultaneously ensuring that there is no shoot-through current from Vin.

Logic circuitry similar to logic circuit 140A can be provided to generate the signal applied by conductor 9 to the gate of transistor section M2-2 to turn it on simultaneously with transistor section M2-1.

Figure 6:
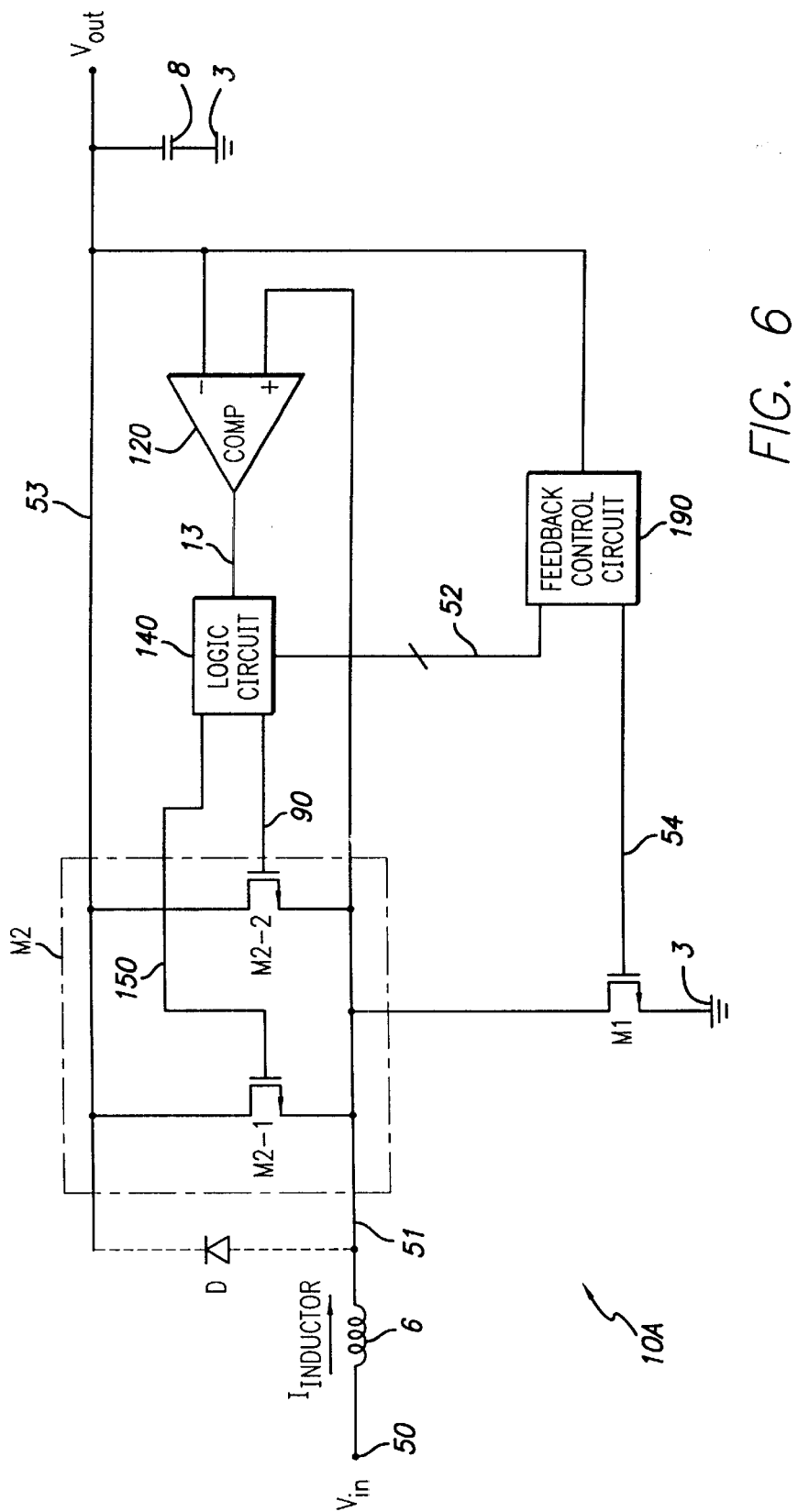
FIG. 6 is a schematic diagram of a synchronous rectifier of the present invention, connected in a boost voltage converter circuit.

FIG. 6 shows an alternative embodiment of the invention in which a boost voltage regulator 10A includes a synchronous rectifier circuit that includes the composite transistor M2 as the "high side" transistor and transistor M1 as the "low side" transistor. In this case, Vin is applied by conductor 50 to a first terminal of inductor 6, a second terminal of which is connected to conductor 51. Conductor 51 is connected to the source electrodes of transistor sections M2-1 and M2-2 and also to the (+) input of comparator 120. The (−) input of comparator 120 is connected by conductor 53 to the output Vout and to the drain electrodes of transistor sections M2-1 and M2-2. Conductor 53 also is connected to the input of feedback control circuit 190, which produces a signal on conductor 54 that is applied to the gate of transistor M1. The source of transistor M1 is connected to ground conductor 3 and its drain is connected to conductor 51. The feedback control circuit 190 produces several control signals on two-conductor bus 52, which are applied to input of logic circuit 140. Logic circuit 140 in FIG. 6 includes two level shifting driver circuits similar to driver circuit in FIG. 2 to produce adequate gate drive signals to the sections of composite transistor M2. The operation of boost regulator 10A in FIG. 6 is quite similar to the operation of buck regulator 10 of FIG. 2, except that Vin is greater than Vout for buck regulator 10 of FIG. 2, whereas Vin is less than Vout for boost regulator 10A of FIG. 6. Preferably, comparator 120 in FIG. 6 has a built-in positive offset voltage in order to cause comparator 120 to accomplish its initial switching early rather than late, as previously explained.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

For example, composite transistor M2 including the single common source electrode and the single common drain electrode and separate gate electrodes as shown in FIG. 2 could be replaced by two separate transistors M2-1 and M2-2 with their separate drains connected together and separate sources connected together as illustrated. Also, more than 2 segments of composite transistor M2 could be provided, with their separate electrodes separately controlled by logic circuit 140.

What is claimed is:

1. An synchronous rectifier circuit comprising:
   (a) a comparator having a first input coupled to a first conductor and a second input coupled to a reference voltage conductor;
   (b) a logic circuit having an input coupled to an output of the comparator, a first output, and a second output; and
   (c) a first transistor having a gate coupled to the first output, a source coupled to the reference voltage conductor, and a drain coupled to the first conductor, and a second transistor having a gate coupled to the second output, a source coupled to the reference voltage conductor, and a drain coupled to the first conductor.

2. The synchronous rectifier circuit of claim 1 wherein the first transistor and a second transistor are portions of a composite transistor.

3. A synchronous rectifier circuit comprising:
   (a) a comparator having a first input coupled to a first conductor and a second input coupled to a reference voltage conductor, the first conductor conducting a current that also flows through an inductor;
   (b) a logic circuit having an input coupled to an output of the comparator, a first output, and a second output; and
   (c) a first transistor having a gate coupled to the first output, a source coupled to the reference voltage conductor, and a drain coupled to the first conductor, and a second transistor having a gate coupled to the second output, a source coupled to the reference voltage conductor, and a drain coupled to the first conductor.

4. The synchronous rectifier circuit of claim 3 wherein the first transistor and a second transistor are portions of a composite transistor.

5. A synchronous rectifier circuit comprising:
(a) a comparator having a first input coupled to a first conductor and a second input coupled to a reference voltage conductor, the first conductor conducting a current that also flows through an inductor;
(b) a logic circuit having an input coupled to an output of the comparator, a first output, and a second output; and
(c) a first transistor section having a gate coupled to the first output, a source coupled to the reference voltage conductor, and a drain coupled to the first conductor, and a second transistor section having a gate coupled to the second output, a source coupled to the reference voltage conductor, and a drain coupled to the first conductor.

6. The synchronous rectifier circuit of claim 5 wherein the comparator has a negative built-in offset voltage, wherein the first transistor section and the second transistor section are portions of a composite transistor having a common source coupled to the reference voltage conductor and a common drain coupled to the first conductor, and wherein a channel resistance of the first transistor section is substantially lower than the channel resistance of the second transistor section.

7. The synchronous rectifier circuit of claim 6 wherein the logic circuit is operative to turn on both the first transistor section and the second transistor section in response to a first switching of the comparator to a "1" level, and to turn off only the first transistor section in response to a second switching of the comparator to the "1" level, and to turn off the second transistor section in response to a third switching of the comparator to the "1" level.

8. The voltage converter circuit of claim 6 wherein the logic circuit is operative to turn on both the first transistor section and the second transistor section in response to a first switching of the comparator from a "0" level to a "1" level and to turn off the second transistor if the comparator does not then switch from the "1" level to the "0" level within a predetermined delay.

9. A signal conversion circuit comprising:
(a) a first transistor having a drain connected to receive an unregulated input voltage, a gate connected to receive a feedback control signal, and a source connected to a first conductor;
(b) an inductor having a first terminal coupled to the first conductor and a second terminal connected to produce a regulated output voltage on an output conductor;
(c) a feedback control circuit coupled between the gate of the first transistor and the output conductor for regulating switching of the first transistor in response to the regulated output voltage;
(d) an synchronous rectifier circuit including
  i. a comparator having a first input coupled to the first conductor and a second input coupled to the reference voltage conductor,
  ii. a logic circuit having an input coupled to an output of the comparator, a first output, and a second output,
  iii. a first transistor section having a gate coupled to the first output, a source coupled to the reference voltage conductor, and a drain coupled to the first conductor and a second transistor section having a gate coupled to the second output, a source coupled to the reference voltage conductor, and a drain coupled to the first conductor, the body diode having a cathode coupled to the first conductor and an anode coupled to the ground conductor.

10. The signal conversion circuit of claim 9 further including an output capacitor coupled between the output conductor and a reference voltage conductor.

11. A signal conversion circuit comprising:
(a) a first transistor having a source connected to the reference voltage conductor, a gate connected to receive a feedback control signal, and a drain connected to a first conductor;
(b) an inductor having a first terminal coupled to an input receiving an unregulated input voltage and a second terminal connected the first conductor;
(c) a feedback control circuit coupled between the gate of the first transistor and an output conductor for regulating switching of the first transistor in response to a regulated output voltage; and
(d) a synchronous rectifier circuit including
  i. a comparator having a first input coupled to the first conductor and a second input coupled to the output conductor,
  ii. a logic circuit having an input coupled to an output of the comparator, a first output, and a second output, and
  iii. a first transistor having a gate coupled to the first output, a drain coupled to the output conductor, and a source coupled to the first conductor and a second transistor having a gate coupled to the second output, a drain coupled to the output conductor, and a source coupled to the first conductor.

12. A voltage converter circuit comprising:
(a) a first transistor having a drain connected to receive an unregulated input voltage, a gate connected to receive a feedback control signal, and a source connected to a first conductor;
(b) an inductor having a first terminal coupled to the first conductor and a second terminal connected to produce a regulated output voltage on an output conductor;
(c) a feedback control circuit coupled between the gate of the first transistor and the output conductor for regulating switching of the first transistor in response to the regulated output voltage;
(d) a synchronous rectifier circuit including
  i. a comparator having a first input coupled to the first conductor and a second input coupled to the reference voltage conductor,
  ii. a logic circuit having an input coupled to an output of the comparator, a first output, and a second output,
  iii. a second transistor having a gate coupled to the first output, a source coupled to the reference voltage conductor, and a drain coupled to the first conductor, and
  iv. a third transistor having a gate coupled to the second output, a source coupled to the reference voltage conductor, and a drain coupled to the first conductor.

13. The voltage converter circuit of claim 12 including an output capacitor coupled between the output conductor and a reference voltage conductor.

14. The voltage converter circuit of claim 12 wherein the comparator has a negative built-in offset voltage.

15. The voltage converter circuit of claim 14 wherein the magnitude of the built-in offset voltage exceeds the magnitude of a statistical variation of offset voltages that characterize a predetermined manufacturing process used to make the voltage converter circuit.

16. The voltage converter circuit of claim 12 wherein the first transistor and the second transistor are portions of a composite transistor having a common source coupled to the reference voltage conductor and a common drain coupled to the first conductor.

17. The voltage converter circuit of claim 16 wherein a channel resistance of the second transistor is substantially lower than a channel resistance of the third transistor.

18. The voltage converter circuit of claim 12 wherein the comparator has a negative built-in offset voltage, wherein the first transistor and the second transistor are portions of a composite transistor having a common source coupled to the reference voltage conductor and a common drain coupled to the first conductor, and wherein a channel resistance of the second transistor is substantially lower than a channel resistance of the third transistor.

19. The voltage converter circuit of claim 17 wherein the logic circuit is operative to turn on both the second transistor and the third transistor in response to a first switching of the comparator to a "1" level, and to turn off only the second transistor in response to a second switching of the comparator to the "1" level, and to turn off the third transistor in response to a third switching of the comparator to the "1" level.

20. The voltage converter circuit of claim 17 wherein the logic circuit is operative to turn on both the second transistor and the third transistor in response to a first switching of the comparator from a "0" level to a "1" level and to turn off the second transistor if the comparator does not then switch from the "1" level to the "0" level within a predetermined delay.

21. The voltage converter circuit of claim 12 wherein the logic circuit is operative to produce a first logic signal indicative of when the first transistor is completely turned off and to rapidly turn on the second and third transistors in response to the first logic signal to avoid delay associated with the comparator.

22. The voltage converter circuit of claim 21 wherein the logic circuit is operative to produce a second logic signal and to disable the comparator in response to the second logic signal immediately before producing the first logic signal.

23. The voltage converter circuit of claim 21 wherein the logic circuit is operative to disable the comparator so as to cause the second and third transistors to be completely turned off immediately before turning on the first transistor.

24. The voltage converter circuit of claim 12 wherein the logic circuit includes means for producing a first logic signal indicative of when the first transistor is completely turned off and rapidly turning on the second and third transistors in response to the first logic signal to avoid delay associated with the comparator.

25. The voltage converter circuit of claim 24 wherein the logic circuit includes means for producing a second logic signal and disabling the comparator in response to the second logic signal immediately before producing the first logic signal.

26. The voltage converter circuit of claim 24 wherein the logic circuit includes means for disabling the comparator so as to cause the second and third transistor to be completely turned off immediately before turning on the first transistor.

27. A method of providing synchronous switching of a current flowing through an inductor and a first conductor, comprising:
   (a) providing a comparator having a first input coupled to the first conductor and a second input coupled to a reference voltage conductor, and providing a logic circuit having an input coupled to an output of the comparator, a first output, and a second output;
   (b) operating the comparator to produce a "1" level in response to a change of voltage of the first conductor caused by the flow of the current; and
   (c) operating the logic circuit in response to the "1" level to turn on both a first transistor and a second transistor in response to a first switching of the comparator to a "1" level, and to turn off only the first transistor in response to a second switching of the comparator to the "1" level, and to turn off the second transistor in response to a third switching of the comparator to the "1" level, the first transistor having a gate coupled to the first output, a source coupled to the reference voltage conductor, and a drain coupled to the first conductor, and the second transistor having a gate coupled to the second output, a source coupled to the reference voltage conductor, and a drain coupled to the first conductor.

28. The method of claim 27 including operating the logic circuit to turn on both the first transistor and the second transistor in response to a first switching of the comparator from a "0" level to a "1" level and to turn off the first transistor if the comparator does not then switch from the "1" level to the "0" level within a predetermined delay.

29. The method of claim 27 including providing the first transistor and the second transistor as sections of a composite transistor having a common source coupled to the reference voltage conductor and a common drain coupled to the first conductor wherein a channel resistance of the first transistor is substantially lower than the channel resistance of the second transistor.

30. The method of claim 29 including providing a built-in offset voltage in an input stage of the comparator.

31. The method of claim 29 including providing a negative built-in offset voltage in an input stage of the comparator.

32. A circuit for providing synchronous switching of a current flowing through an inductor and a first conductor, comprising:
   (a) a comparator having a first input coupled to the first conductor and a second input coupled to a reference voltage conductor;
   (b) means for operating the comparator to produce a "1" level in response to a change of voltage of the first conductor caused by the flow of the current; and
   (c) means for operating in response to the "1" level to turn on both a first transistor and a second transistor in response to a first switching of the comparator to a "1" level, and to turn off only the first transistor in response to a second switching of the comparator to the "1" level, and to turn off the second transistor in response to a third switching of the comparator to the "1" level, the first transistor having a gate coupled to the first output, a source coupled to the reference voltage conductor, and a drain coupled to the first conductor, and the second transistor having a gate coupled to the second output, a source coupled to the reference voltage conductor, and a drain coupled to the first conductor.

33. The circuit of claim 32 including means for turning on both the first transistor and the second transistor in response to a first switching of the comparator from a "0" level to a "1" level and for turning off the first transistor if the comparator does not then switch from the "1" level to the "0" level within a predetermined delay.

34. The circuit of claim 32 wherein the first transistor and the second transistor are sections of a composite transistor having a common source coupled to the reference voltage conductor and a common drain coupled to the first conductor and wherein a channel resistance of the first transistor is substantially lower than the channel resistance of the second transistor.

35. The circuit of claim 34 including means for providing a positive built-in offset voltage in the comparator.

36. The method of claim 34 including means for providing a negative built-in offset voltage in the comparator.

37. A voltage converter circuit comprising:
 (a) a first transistor having a drain connected to receive an unregulated input voltage, a gate connected to receive a feedback control signal, and a source connected to a first conductor;
 (b) an inductor having a first terminal coupled to the first conductor and a second terminal connected to produce a regulated output voltage on an output conductor;
 (c) a feedback control circuit coupled between the gate of the first transistor and the output conductor for regulating switching of the first transistor in response to the regulated output voltage; and
 (d) a synchronous rectifier circuit including
  i. a comparator having a first input coupled to the first conductor and a second input coupled to the reference voltage conductor,
  ii. a logic circuit having an input coupled to an output of the comparator, a first output, and a second output,
  iii. a second transistor having a gate coupled to the first output, a source coupled to the reference voltage conductor, and a drain coupled to the first conductor; and
 (e) wherein the logic circuit is operative to produce a first logic signal indicative of when the first transistor is completely turned off and to rapidly turn on the second transistor in response to the first logic signal to avoid delay associated with the comparator.

38. The voltage converter circuit of claim 37 wherein the logic circuit is operative to produce a second logic signal and to disable the comparator in response to the second logic signal immediately before producing the first logic signal.

39. The voltage converter circuit of claim 27 wherein the logic circuit is operative to disable the comparator so as to cause the second transistor to be completely turned off immediately before turning on the first transistor.

40. A voltage converter circuit comprising:
 (a) a first transistor having a drain connected to receive an unregulated input voltage, a gate connected to receive a feedback control signal, and a source connected to a first conductor;
 (b) an inductor having a first terminal coupled to the first conductor and a second terminal connected to produce a regulated output voltage on an output conductor;
 (c) a feedback control circuit coupled between the gate of the first transistor and the output conductor for regulating switching of the first transistor in response to the regulated output voltage; and
 (d) a synchronous rectifier circuit including
  i. a comparator having a first input coupled to the first conductor and a second input coupled to the reference voltage conductor,
  ii. a logic circuit having an input coupled to an output of the comparator, a first output, and a second output,
  iii. a second transistor having a gate coupled to the first output, a source coupled to the reference voltage conductor, and a drain coupled to the first conductor;
 (e) wherein the logic circuit includes means for producing a first logic signal indicative of when the first transistor is completely turned off and rapidly turning on the second transistor in response to the first logic signal to avoid delay associated with the comparator.

41. The voltage converter circuit of claim 40 wherein the logic circuit includes means for producing a second logic signal and disabling the comparator in response to the second logic signal immediately before producing the first logic signal.

42. The voltage converter circuit of claim 30 wherein the logic circuit includes means for disabling the comparator so as to cause the second transistor to be completely turned off immediately before turning on the first transistor.

* * * * *